May 26, 1959 E. D. PADGETT 2,888,336

COLOR CODED PRINTED CIRCUIT

Filed Feb. 25, 1957

INVENTOR.
EDWARD D. PADGETT
BY Harry Langsam
Stanley Belker
ATTORNEYS

United States Patent Office 2,888,336

Patented May 26, 1959

2,888,336

COLOR CODED PRINTED CIRCUIT

Edward D. Padgett, Morristown, N.J.

Application February 25, 1957, Serial No. 642,266

2 Claims. (Cl. 41—43)

My invention relates to printed circuits and more particularly relates to printed circuit having color coded insulation thereover and the method for producing the same.

The usual procedure for making printed circuits comprised bonding a relatively thin sheet of copper foil to a base panel of dielectric insulating material such as polystyrene, Bakelite, Teflon or the like. The desired circuit design was then imprinted on the foil surfaces with a suitable ink followed by a coating of acid etch resist powder on the tacky ink, or the copper sheet was coated with a photoengraver's resist and a light pattern corresponding to the circuit to be produced focussed upon the surface. In the latter procedure, the circuit image was developed in the resist to mask selected portions of the copper foil.

The unmasked portions of the copper surface were then etched in a convenient solution such as ferric chloride to remove portions of the surface not covered by resist material.

In accordance with the present invention, each of the components of the circuit design is overcoated with a colored insulation which is coded to identify the particular component with the remainder of the circuitry. For example, it is possible to employ standard RETMA (or IRE) color codes; where No. 0 is black, No. 1—brown, No. 2—red, No. 3—orange, No. 4—yellow, No. 5—green, No. 6—blue, No. 7—violet, No. 8—grey, and No. 9—white to identify the printed strips for line tracing purposes. The broad aspects of the present invention also include the design imprinting of the copper clad dielectric panel with a film of color impregnated insulation which is resistant to acid etching whereby the unwanted or unmasked portion of the bonded metal foil or sheet may be removed during the etching procedure leaving the printed strips of the circuit remaining, each having a color coded insulation coat thereover.

Therefore, the coating materials used in my color coded printed circuit must be not only electrical insulators but also they must be water and acid resistant to avoid being washed away during the etching procedure. The colors selected also must be acid, water and high temperature resistant dyes or pigments and may be azo, diazo, nitroso, nitro or other selected organic compounds or inorganic dyes which furthermore will not react unfavorable with the metal foil or the dielectric panel.

Accordingly, it is an object of my invention to provide a printed circuit wherein each component strip is color coded with an electrically resistant overlay.

Another object of my invention is to provide a color coded printed circuit wherein each component strip may be identified and traced with respect to the connecting circuitry.

Another object of my invention is to provide a method for producing a color coded printed circuit.

Another object of my invention is to provide a method for forming a printed circuit wherein the "resist" overcoating is color coded and permitted to remain after etching as a permanent identifying insulating overlay.

Another object of my invention is to provide a color coded printed circuit in which the conducting elements are embedded in the insulating base.

Other objects of my invention are to provide an improved device of the character described, that is easily and economically produced, which is sturdy in construction, and which is highly efficient in operation.

With the above and related objects in view, my invention consists in the details of construction and combination of parts, as will be more fully understood from the following description, when read in conjunction with the accompanying drawings, in which.

Figure 1:
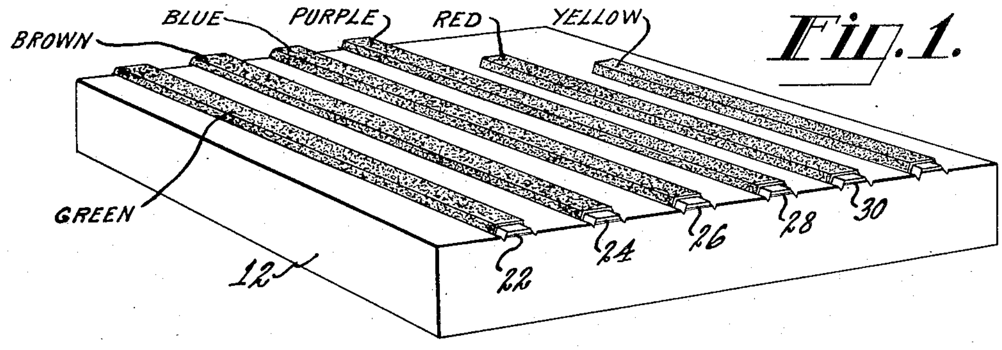
Fig. 1 is a perspective view of a color coded printed circuit embodying my invention.

Referring now in greater detail to the drawings in which similar reference characters refer to similar parts, I show a dielectric panel 12 upon which a sheet of copper foil 14, .0005 to .005 inch in thickness has been bonded in the usual manner by either cementing the copper sheet upon the panel or by sprinkling pure copper powder upon a layer of suitable adhesive applied upon the panel followed by application of heat and pressure.

One embodiment of my invention employs the use of a scriber knife 16 having a pair of blades 18 spaced from each other by a bight portion 20, the blade spacing being the width of the printed circuit strip to be cut. The height of the bight portion from the apex of each blade governs the depth of the cut which for optimum results should be approximately one mil greater than the thickness of the copper foil.

Figure 2:
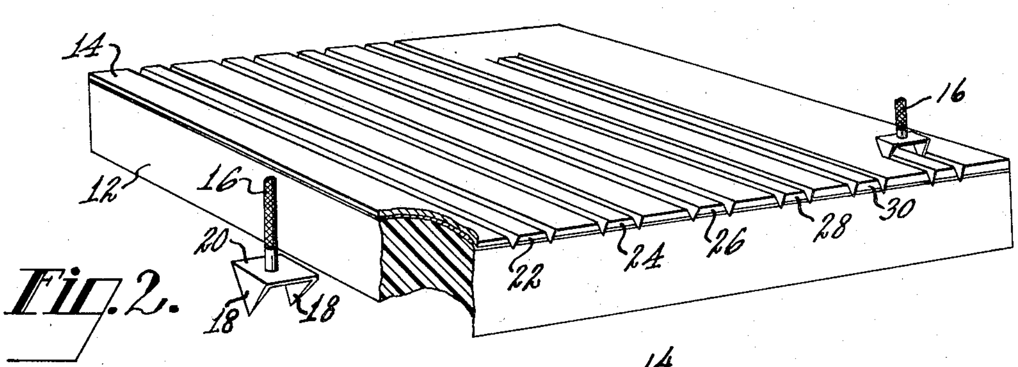
Fig. 2 is a perspective view of the metal clad panel showing the initial steps in preparing the circuit design by a knife scriber having spaced blades.

The copper foil 14 is then scribed by the knife 16 into a series of strips 22, 24, 26, 28 and 30, in accordance with the required circuitry design using a guide or other template, the valleys on either side of each strip being cut partially into the dielectric panel 12. See Fig. 2.

Figure 3:
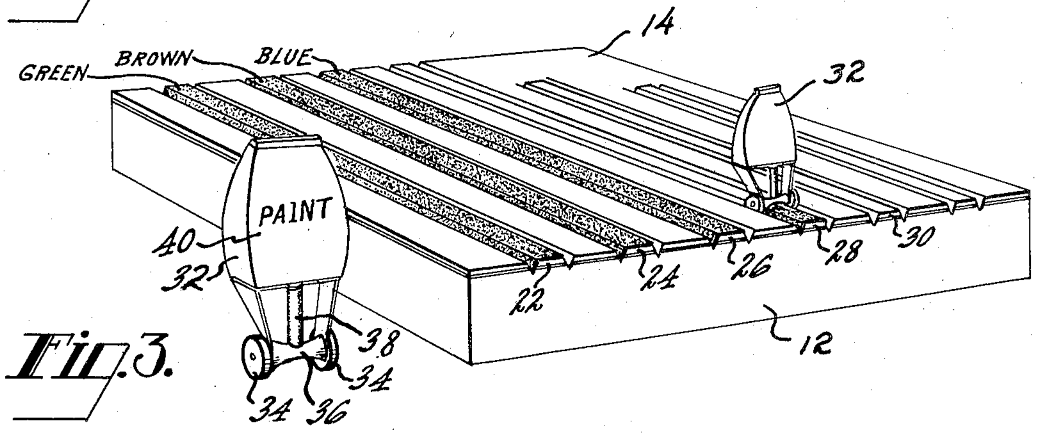
Fig. 3 is a perspective view of the panel shown in Fig. 1 illustrating the step of applying a film of colored coating to the prepared strips for masking.

As shown in Fig. 3, an applicator 32 having a pair of guides 34, which are spaced the same distance apart as the blades 18 of the knife 16, is used to apply a coating overlay to each of the strips 22 to 30 respectively. A roller 36 is journalled intermediate the guides 34 and is contacted by a wick 38 which extends from a suitable reservoir or container 40 having color "resist" coating material therein. A particular colored coating material is applied upon its respective strip by rolling the applicator 32 thereover whereby the coating film covers the entire strip to be masked and identified, the film extending into the valleys on either side thereof.

Examples of formulations for color coatings are as follows:

| | Percent | |
|---|---|---|
| Pigment | 50 to 60 | |
| Binder | 20 to 30 | 50 to 40 |
| Plasticizer | 10 | |
| Solvent | 10 | |

Satisfactory binders include cellulose acetate butyrate and cellulose propionate or other cellulose esters. Acrylic acid esters have also proven to be effective binders.

Suitable materials for use as solvents include butyl acetate, amyl acetate, butanone and methyl ethyl ketone and/or diol condensations (reaction 10 to 80 percent complete).

The plasticizer may be any polyester condensation product of resin gums and acids together with higher organic alcohols and/or anhydrides from 7 to 30 carbons in length.

An example of a white pigment is:

| | Percent |
|---|---|
| Titanium dioxide, $TiO_2$ | 60 to 70 |
| Antimony oxide, $Sb_2O_3$ | 10 to 20 |
| Barium sulphate, $BaSO_4$ | 20 |

An example of a black pigment is the black magnetic solid solution of the general formula $FeO.Fe_2O_3Al_2O_3$ resulting from the firing of powdered iron and aluminum oxide at temperatures exceeding 1400° C., the resultant produce being ground to a particle size of 10 microns.

Suitable red and orange pigments may be prepared from the red oxides of lead and iron, or oxide glasses.

As set forth hereinbefore, organic pigments or dyes may be utilized so long as they act as insulators and are resistant to water, acid and moderately high temperatures (150° C.).

As is apparent from the foregoing formulations, the coating material is relatively viscous and a squeeze bottle of polyethylene or the like may be employed as the reservoir 40. However, the application of the colored coating set forth above is not intended as being restrictive since the coating may also be applied by brush, spray, silk screen process or by printing. After the application of the colored coating material to the conductive strips, the entire panel is baked for one to three hours at a temperature of 30° C. to 125° C. The panel is then immersed in an etching bath of aqueous ferric chloride 35° to 48° Baumé wherein the exposed copper surface which is not masked by the colored coating is etched away. Thus, it is necessary that the coating films are resistant to the aqueous acid solutions and the color coded film remains to insulate, protect from atmospheric conditions and identify each of the printed strips. If desired, portions of the coating may be removed from any particular strip in order to solder leads thereon or to apply eyelet contacts for connecting resistors, capacitors, or other circuit components.

Figure 4:
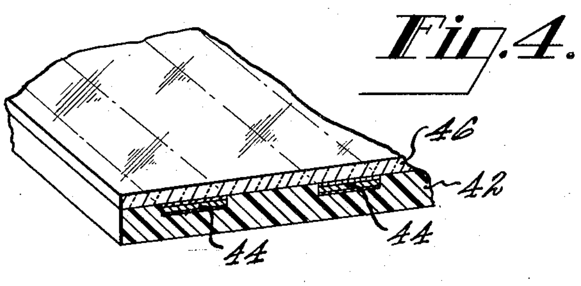
Fig. 4 is a perspective view of a color coded printed circuit wherein conductive strips are inlaid within a recessed panel.

Another embodiment of my invention as shown in Fig. 4, employs a recessed dielectric panel 42 which is molded with a plurality of slots for insertion therein of complementary formed conductive strips 44. The strips 44 may have the color coded insulation already applied before inlaying within the recessed panel 42 or the color coding may be applied to the strips after their insertion and cementing within the slots of the panel. In either event the coating film may be applied to the strips in the manner set forth in the first described embodiment.

While the color coded printed circuits described herein are resistant to corrosion, an overlay of a transparent sheet 46 is sometimes bonded over the surface of the panel to further protect the conductive strips from damage or deterioration. Kel-F (tri-fluoro-chloro-ethylene) or polyethylene sheets have proven to be satisfactory in this respect.

Although my invention has been described in considerable detail, such description is intended as being illustrative rather than limiting, since the invention may be variously embodied, and the scope of the invention is to be determined as claimed.

I claim as my invention.

1. The method for making a color coded printed circuit comprising the steps of cutting the metal foil of a metal clad dielectric panel into a plurality of strips wherein the cuts extend in valleys on either side thereof into the surface of the panel, applying a coat of acid resisting colored coded insulating film to each strip respectively whereby the coating extends into the valley on either side of each strip, each strip having an identifying colored film thereover, and subjecting the panel to an etching bath whereby the unmasked portions of the metal foil will be etched away and leaving a plurality of the color coded conductive strips remaining.

2. A method for making a color coded printed circuit comprising the steps of scribing a plurality of pairs of spaced grooves in the metal foil of a metal clad dielectric panel to define a plurality of strips, each having a valley on each side thereof extending through the foil, applying respectively a coating of acid-resisting, color-coded, insulating film to each strip by an applicator having a pair of rolls spanning the grooved pairs and engaging the face of the strip whereby the coating extends into the spaced valleys, baking the panel to harden the films, and subjecting the panel to an etching bath whereby the unmasked portions of the metal foil will be etched away leaving a plurality of individually color-coded, conductive strips remaining.

References Cited in the file of this patent

UNITED STATES PATENTS

| | | |
|---|---|---|
| 2,028,013 | Reilly | Jan. 14, 1936 |
| 2,647,852 | Franklin | Aug. 4, 1953 |
| 2,758,074 | Black et al. | Aug. 7, 1956 |